United States Patent
Lee (10) Patent No.: US 9,502,463 B2
(45) Date of Patent: Nov. 22, 2016

(54) METHOD FOR FABRICATING IMAGE SENSOR DEVICE

(71) Applicant: TAIWAN SEMICONDUCTOR MANUFACTURING CO., LTD., Hsinchu (TW)

(72) Inventor: Yueh-Chuan Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/153,615

(22) Filed: May 12, 2016

(65) Prior Publication Data

US 2016/0260770 A1    Sep. 8, 2016

Related U.S. Application Data (62) Division of application No. 14/155,895, filed on Jan. 15, 2014, now Pat. No. 9,368,543.

(51) Int. Cl.
 *H01L 27/146* (2006.01)
 *H01L 31/18* (2006.01)

(52) U.S. Cl.
 CPC ..... *H01L 27/14689* (2013.01); *H01L 27/1463* (2013.01); *H01L 27/14612* (2013.01); *H01L 27/14643* (2013.01); *H01L 31/1812* (2013.01)

(58) Field of Classification Search
 CPC .............. H01L 21/02381; H01L 21/0245; H01L 21/02532
 See application file for complete search history.

(56) References Cited

U.S. PATENT DOCUMENTS

| | | | |
|---|---|---|---|
| 5,440,152 A | 8/1995 | Yamazaki | |
| 6,448,614 B2 | 9/2002 | Kubo et al. | |
| 6,724,019 B2 | 4/2004 | Oda et al. | |
| 7,345,308 B2 | 3/2008 | Sakano et al. | |
| 7,902,577 B2 | 3/2011 | Kang et al. | |
| 8,120,079 B2 | 2/2012 | Augusto | |
| 8,502,284 B2 | 8/2013 | Tamura | |
| 8,748,940 B1 * | 6/2014 | Rachmady | H01L 29/785 257/190 |
| 2010/0330723 A1 | 12/2010 | Okabe et al. | |
| 2011/0062540 A1 | 3/2011 | Saito et al. | |
| 2014/0054444 A1 | 2/2014 | Sasaki | |
| 2016/0247922 A1 * | 8/2016 | He | H01L 29/7848 |

OTHER PUBLICATIONS

Yangfan Zhou et al., "Image Lag Optimization of Four-Transistor Pixel for High Speed CMOS Image", Proc. of SPIE vol. 8194 819435, 6 Pgs, (2011).

People, R, "Indirect band gap of coherently strained GexSi1-x bulk alloys on (001) silicon substrates", Physical Review B, vol. 32, No. 2, Jul. 15, 1985, 4 pgs.

(Continued)

*Primary Examiner* — Eugene Lee
(74) *Attorney, Agent, or Firm* — Maschoff Brennan (57) ABSTRACT

An image sensor device includes a silicon-based substrate, a silicon-germanium epitaxy layer, an isolation feature, an active pixel cell and a logic circuit. The silicon-germanium epitaxy layer is on the silicon-based substrate, in which the silicon-germanium epitaxy layer has a composition of $Si_{1-x}Ge_x$, where $0<x<1$. The isolation feature is disposed in the silicon-germanium epitaxy layer to define a pixel region and a periphery region of the silicon-germanium epitaxy layer. The active pixel cell is disposed in the pixel region of the silicon-germanium epitaxy layer. The logic circuit is disposed in the periphery region.

20 Claims, 5 Drawing Sheets

(56) References Cited

OTHER PUBLICATIONS

Douglas J Paul, "Si/SiGe heterostructures: from material and physics to devices and circuits", Semicond. Sci. Technol. 19 (2004) R75-R108, 34 pgs.

Gregory A. Mitchell, "The Role of the Silicon Germanium (SiGe) Heterojunction Bipolar Transistor (HBT) in Mobile Technology Platforms", Army Research Laboratory, Sep. 2011, 38 pgs.

Peter Ashburn, "Properties and Growth of Silicon-Germanium", SiGe Heterojunction Bipolar Transistors, pp. 121-147, 2003.

G.L. Patton et al., "SiGe-Base Heterojunction Bipolar Transistors: Physics and Design Issues", IBM Research Division, T.J. Watson Research Center, Yorktown Hts., NY 10598, (914) 945-3631, 4 pgs, (1990).

D. L. Harame et al., "Si/SiGe Epitaxial-Base Transistors—Part I: Materials, Physics, and Circuits", IEEE Transactions on Electron Devices, vol. 42, No. 3, Mar. 1995, 14 pgs.

\* cited by examiner

METHOD FOR FABRICATING IMAGE SENSOR DEVICE

PRIORITY CLAIM AND CROSS-REFERENCE

This is a divisional application of U.S. patent application Ser. No. 14/155,895 filed on Jan. 15, 2014, which is incorporated herein by reference in its entirety.

BACKGROUND

Complementary Metal-Oxide-Semiconductor (CMOS) image sensors (CIS) are used in numerous applications including digital still cameras. In semiconductor technologies, image sensors are used for sensing exposed lights emitted towards a semiconductor substrate. Generally, CIS products include a pixel (or pixel array) region and a periphery region. These products utilize an array of active pixels (i.e., image sensor elements or cells) including photodiodes and other elements (e.g., transistors) to convert images into digital data or electrical signals. Each of the photodiodes includes a p-type pinned photodiode and a n-type pinned photodiode to form a pn junction for transforming photons to electrons, and the performance of the photodiodes are affected by dark current (DC) or white pixel (WP) performance caused by various factors.

In a conventional skill, each of the photodiodes may include an n-type pinned photodiode and a p-type pinned photodiode. The n-type pinned photodiode may be formed in a p-type semiconductor substrate and then the p-type pinned photodiode is formed and embedded in a portion of the n-type pinned photodiode. The remaining portion of the n-type pinned photodiode is adjacent to the aforementioned transistor, and the aforementioned electrons may move through the remaining portion of the n-type pinned photodiode to a channel below and controlled by the transistor. However, the remaining portion has a relatively small area, which results in an additional potential barrier in the boundary between the p-type pinned photodiode and the transistor, and is disadvantageous to transferring the electrons and inducing an image lag accordingly. On the contrary, if the remaining portion has a relatively large area (which means the p-type pinned photodiode embedded in a relatively small area in the n-type pinned photodiode), the dark current or white pixel performance is poorer. Therefore, it is a trade-off between the image lag and the dark current or white pixel performance.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

Embodiments of the present disclosure provide an image sensor device to sense lights emitted to the front or back side of the image sensor device by forming a silicon-germanium epitaxy layer on a silicon-based substrate. In detail, the silicon-germanium epitaxy layer has a bandgap energy lower than that of a conventional pure silicon epitaxy layer. Namely, although the aforementioned additional potential barrier is induced by embedding the p-type pinned photodiode in a relatively large portion in the n-type pinned photodiode for improving the dark current or white pixel performance, the total band gap energy is decreased by the silicon-germanium epitaxy layer, thereby improving the aforementioned image lag. Therefore, both the dark current or white pixel performance and the image lag issues are considered in embodiments of the present disclosure.

Figure 1A:
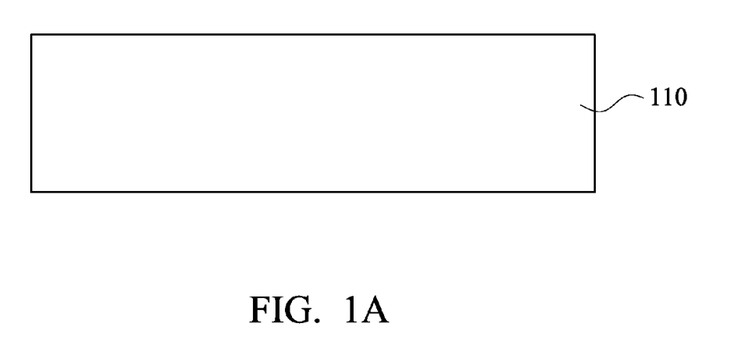
FIG. 1A-1D are schematic cross-sectional views of intermediate stages showing a method for fabricating an image sensor device in accordance with some embodiments.

FIG. 1A-1D are schematic cross-sectional views of intermediate stages showing a method for fabricating an image sensor device 100 in accordance with some embodiments. As shown in FIG. 1A, a silicon-based substrate 110 is provided. In some embodiments, the silicon-based substrate 110 is formed from such as pure silicon or silicon-germanium.

Figure 1B:
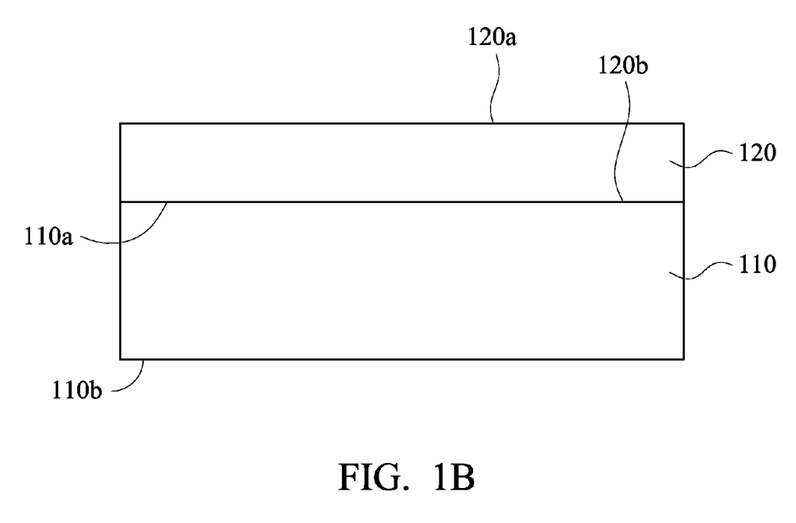

As shown in FIG. 1B, a silicon-germanium epitaxy layer 120 is formed on the silicon-based substrate 110, in which the silicon-germanium epitaxy layer 120 has a composition of $Si_{1-x}Ge_x$, where $0<x<1$. In some embodiments, the silicon-germanium epitaxy layer 120 may be deposited by physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (AL-CVD) or sub-atmospheric CVD (SACVD).

Figure 1C:
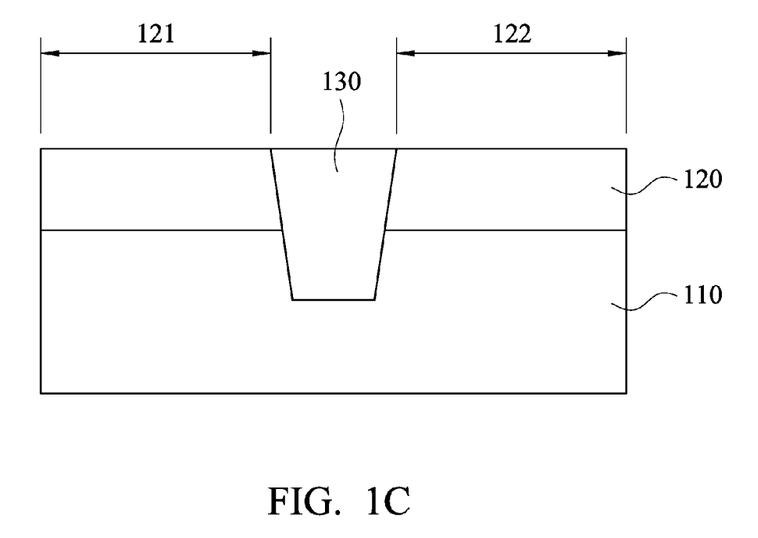

As shown in FIG. 1C, an isolation feature 130 including, such as a silicon oxide, a trench isolation, silicon dioxide or a field oxide (FOX), is formed in the silicon-germanium epitaxy layer 120 to define a pixel region 121 and a periphery region 122 of the silicon-germanium epitaxy layer 120. In some embodiments, some isolation features 130 may be shallow trench isolations (STIs) used to separate and isolate photodiodes, memory cells or SRAM cells in an array area, and some isolation features 130 are deep trench isolations used to separate and isolate NMOS and PMOS devices in the peripheral area. The structures, materials, depth of the STI or the deep trench isolation can be different in different areas. Specific STI profile and material may be needed for meeting certain device requirements.

Figure 1D:
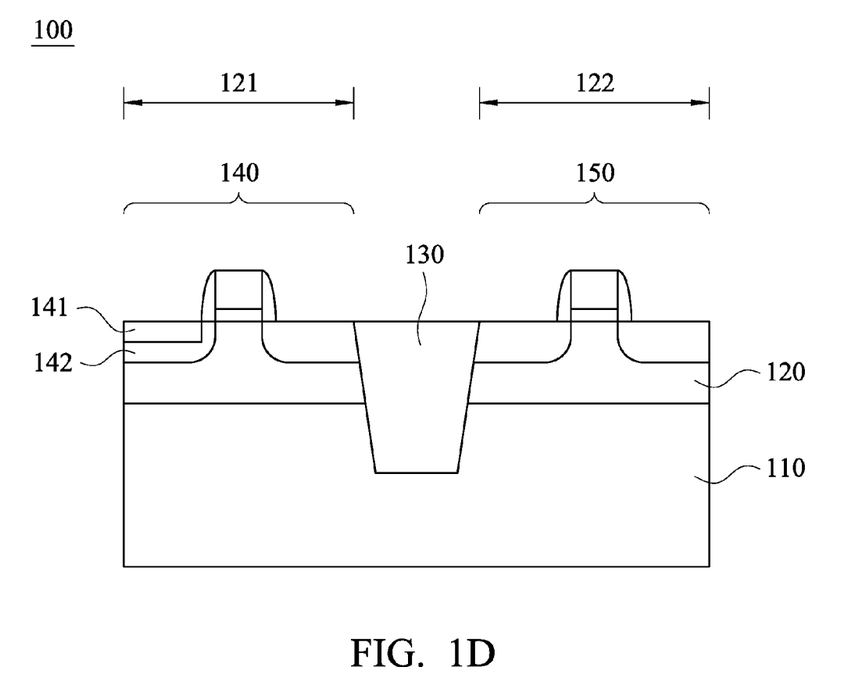

As shown in FIG. 1D, an active pixel cell 140 is formed in the pixel region 121 of the silicon-germanium epitaxy layer 120, and a logic circuit 150 (such as a CMOS logic circuit) is formed in the periphery region 122. In some embodiments, the active pixel cell 140 may include active image sensing elements such as photodiodes, in addition to adjacent transistor structures such as transfer transistors and reset transistors. These transistor structures, as well as additional devices used for the control and signal circuits in the peripheral region 122 of the image sensor cells 100, or used for peripheral logic circuits 150, are included in CMOS devices. Therefore, for reducing process cost and complexity, image sensor cells are fabricated using the same CMOS process sequences used for the peripheral CMOS logic circuits.

It is noted that, in a conventional skill, a silicon epitaxy layer is formed on a silicon substrate. In some embodiments, the silicon-germanium epitaxy layer 120 is formed on the silicon-based substrate 110 which is different from the silicon epitaxy layer used in the conventional technique. The bandgap energy of germanium is about 0.66 eV, and the band gap energy of silicon is about 1.12 ev. In general, by doping or implanting about 1% germanium into a silicon epitaxy layer, the band gap energy of the silicon epitaxy layer is decreased by about 7.5 meV. Therefore, the silicon-germanium epitaxy layer 120 has a bandgap energy lower than that of a conventional pure silicon epitaxy layer. Namely, although the aforementioned additional potential barrier is induced by embedding a p-type pinned photodiode 141 of the active pixel cell 140 in a relatively large portion in a n-type pinned photodiode 142 of the active pixel cell 140 for improving the dark current or white pixel performance, the total bandgap energy is decreased by the silicon-germanium epitaxy layer 120, thereby improving the aforementioned image lag. Thus, both the dark current or white pixel performance and the image lag are considered.

Figure 2A:
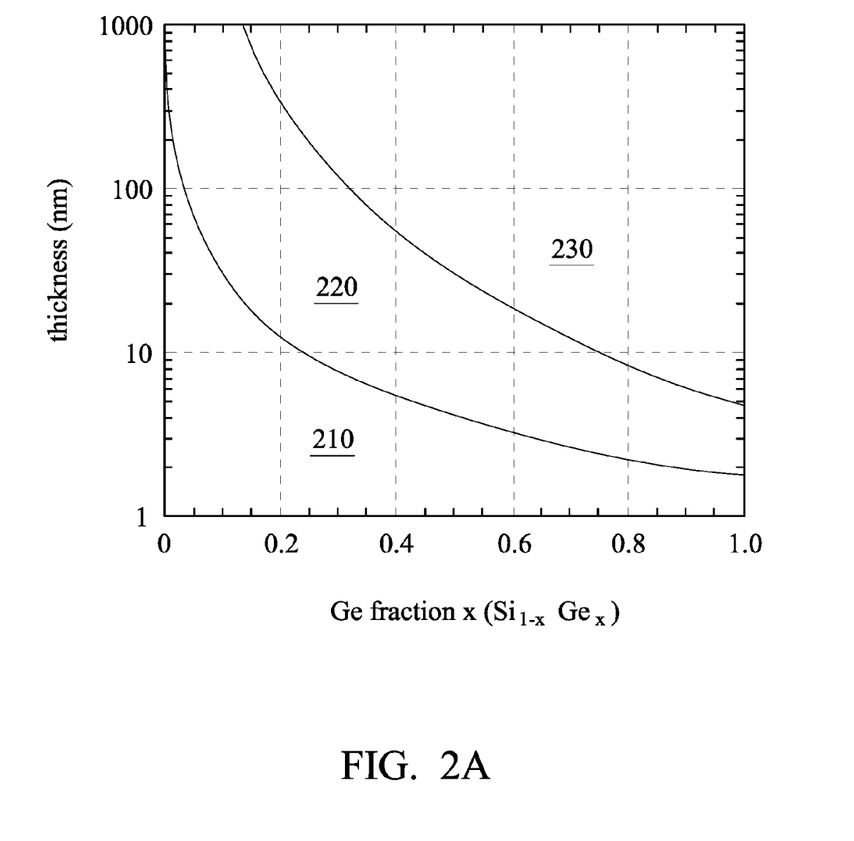
FIG. 2A is a schematic diagram showing thickness plotted against germanium fraction for silicon-germanium epitaxy layer grown on a silicon substrate.
Figure 2B:
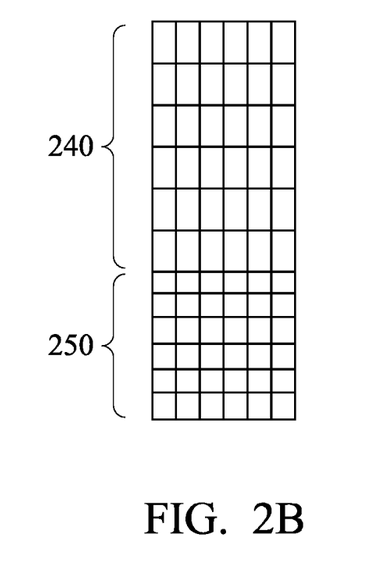
FIG. 2B is a schematic diagram showing a strained silicon-germanium lattice structure.
Figure 2C:
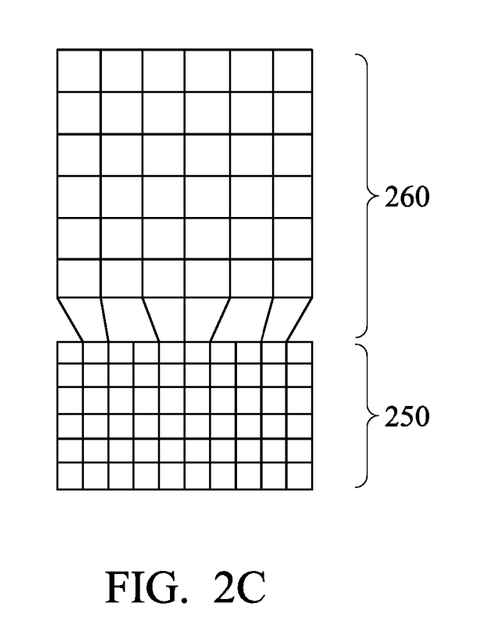
FIG. 2C is a schematic diagram showing a relaxed-with-dislocations silicon-germanium lattice structure.

FIG. 2A is a schematic diagram showing thickness plotted against germanium fraction for silicon-germanium epitaxy layer 120 grown on a silicon substrate 110, FIG. 2B is a schematic diagram showing a strained silicon-germanium lattice structure and FIG. 2C is a schematic diagram showing a relaxed-with-dislocations silicon-germanium lattice structure. As shown in FIG. 2A, the schematic diagram of FIG. 2A is divided into three areas which include a stable area 210, a metastable area 220 and a relaxed-with-dislocations area 230. In detail, germanium has a larger lattice constant than silicon by about 4.2%, and thus a thickness of a heterolayer (i.e., silicon-germanium epitaxy layer 120) may be grown coherently on a top surface of the silicon substrate 250, thereby forming a strained silicon-germanium lattice structure 240, as shown in FIG. 2B. In general, if the relationship between the thickness and the composition of $Si_{1-x}Ge_x$ is in the stable area 210, the strained silicon-germanium lattice structure 240 is stable. Further, if the relationship between the thickness and the composition of $Si_{1-x}Ge_x$ is in the metastable area 220, the strained silicon-germanium lattice structure 240 is formed but is relaxed under a high-stress condition or an over-time condition such that a relaxed-with-dislocations silicon-germanium lattice structure 260 is formed, as shown in FIG. 2C. Besides, if the relationship between the thickness and the composition of $Si_{1-x}Ge_x$ is in the relaxed-with-dislocations area 230, the relaxed-with-dislocations silicon-germanium lattice structure is formed.

According to the above description, the silicon-germanium epitaxy layer 120 of the present disclosure may have a composition of $Si_{1-x}Ge_x$, where 0<x≤0.05, thereby forming a stable strained silicon-germanium epitaxy layer 120 with a thickness in a range from about 2 nanometers to about 60 nanometers. In some embodiments, if x is increased, the stable strained silicon-germanium epitaxy layer 120 may be formed to have a thickness in a range from about 3 nanometers to about 10 nanometers.

In some embodiments, the silicon-germanium epitaxy layer 120 has a top surface 120a and a bottom surface 120b opposite to the top surface 120a, and the bottom surface 120b is connected to the silicon-based substrate 110, in which x is increasing from the bottom surface 120b to the top surface 120a. In detail, the bottom surface 120b of the silicon-germanium epitaxy layer 120 may have a composition of $Si_{1-x}Ge_x$, where x is about 0.01 or nearly 0, and the top surface 120a of the silicon-germanium epitaxy layer 120 may have a composition of $Si_{1-x}Ge_x$, where x is about 0.99 or nearly 1, thereby forming a compositional gradient silicon-germanium epitaxy layer 120. In some embodiments, the aforementioned compositional gradient silicon-germanium epitaxy layer 120 is more stable and thicker than a fixed composition silicon-germanium epitaxy layer with a composition of $Si_{1-x}Ge_x$, where x is about 0.99 or nearly 1. It is noted that, x of the top surface 120a or the bottom surface 120b may be respectively decreased or increased according to different image sensor devices 100. For example, the bottom surface 120b of the silicon-germanium epitaxy layer 120 may have a composition of $Si_{1-x}Ge_x$, where x is about 0.05, and the top surface 120a of the silicon-germanium epitaxy layer 120 may have a composition of $Si_{1-x}Ge_x$, where x is about 0.4. However, the compositions of the top surface 120a and the bottom surface 120b are not limited thereto.

In some embodiments, the silicon-based substrate 110 may be a silicon-germanium substrate 110. The silicon-germanium substrate 110 has a top surface 110a and a bottom surface 110b opposite to the top surface 110a, in which the silicon-germanium substrate 100 has a composition of $Si_{1-y}Ge_y$, where 0<y<x. The silicon-germanium substrate 110 may enhance the efficiency of electrons transferred from the bottom surface 110b to the top surface 110a.

In some embodiments, the top surface 110a of the aforementioned silicon-germanium substrate 110 is connected to the silicon-germanium epitaxy layer 120, in which y is increasing from the bottom surface 110b to the top surface 110a, thereby forming a compositional gradient silicon-germanium substrate 110. In some embodiments, the silicon-germanium epitaxy layer 120 with a composition of $Si_{1-x}Ge_x$ may be a fixed composition silicon-germanium epitaxy layer 120 or a compositional gradient silicon-germanium epitaxy layer 120, where y<x<1. In certain embodiments, a composition of $Si_{1-x}Ge_x$ of the bottom surface 120b of the silicon-germanium epitaxy layer 120 may be nearly the same with a composition of $Si_{1-y}Ge_y$ of the top surface 110a of the silicon-germanium substrate 110 (i.e., x is nearly the same with y), thereby enhancing the stability of interface between the silicon-germanium epitaxy layer 120 and the silicon-germanium substrate 110.

Figure 3:
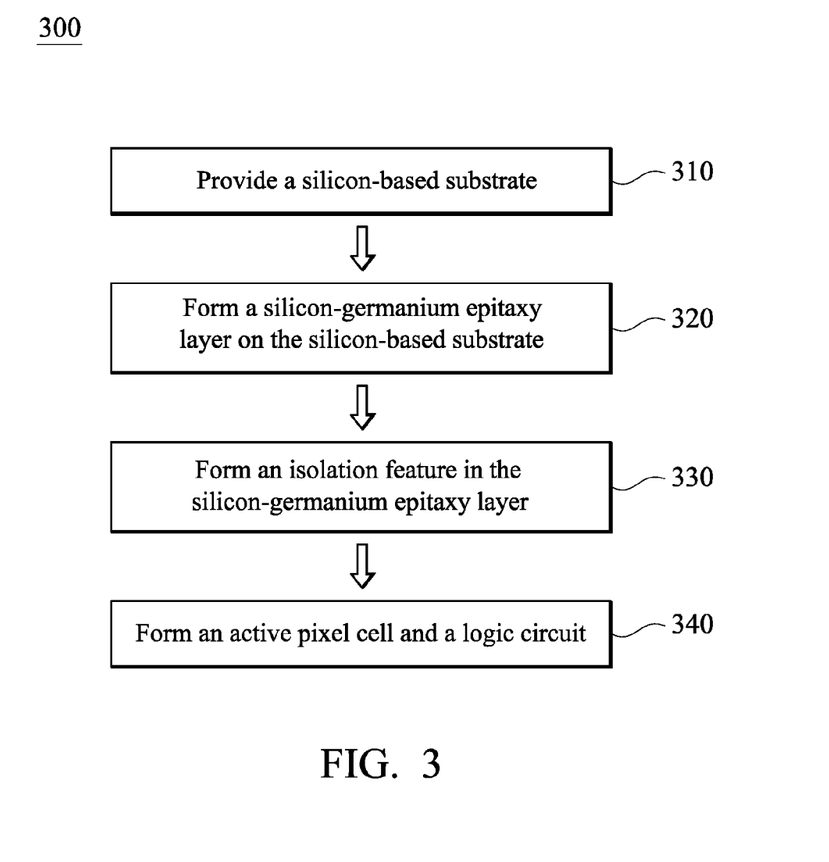
FIG. 3 is a flow chart of a method for fabricating an image sensor device in accordance with various embodiments.

Referring to FIG. 3 together with FIG. 1A-FIG. 1B, FIG. 3 is a flow chart of a method 300 for fabricating an image sensor device in accordance with various embodiments. The method 300 begins at operation 310, where a silicon-based substrate 110 is provided, as shown in FIG. 1A. In some embodiments, the silicon-based substrate 110 is a silicon substrate. At operation 320, a silicon-germanium epitaxy layer 120 is formed on the silicon-based substrate 110, in which the silicon-germanium epitaxy layer 120 has a composition of $Si_{1-x}Ge_x$, where 0<x<1, as shown in FIG. 1B. In some embodiments, the silicon-germanium epitaxy layer 120 has a composition of $Si_{1-x}Ge_x$, where 0<x<0.05. At operation 330, an isolation feature 130 is formed in the silicon-germanium epitaxy layer 120 to define a pixel region 121 and a periphery region 122 of the silicon-germanium epitaxy layer 120. At operation 340, an active pixel cell 140 and a logic circuit 150 are formed respectively in the pixel region 121 and in the periphery region 122 of the silicon-germanium epitaxy layer 120, as shown in FIG. 1D.

In accordance with some embodiments, the present disclosure discloses an image sensor device including a silicon-based substrate, a silicon-germanium epitaxy layer, an isolation feature, an active pixel cell and a logic circuit. The silicon-germanium epitaxy layer is on the silicon-based substrate, in which the silicon-germanium epitaxy layer has a composition of $Si_{1-x}Ge_x$, where $0<x<1$. The isolation feature is disposed in the silicon-germanium epitaxy layer to define a pixel region and a periphery region of the silicon-germanium epitaxy layer. The active pixel cell is disposed in the pixel region of the silicon-germanium epitaxy layer. The logic circuit is disposed in the periphery region.

In accordance with certain embodiments, the present disclosure discloses a method for fabricating an image sensor device. In this method, a silicon-based substrate is provided. A silicon-germanium epitaxy layer is formed on the silicon-based substrate, in which the silicon-germanium epitaxy layer has a composition of $Si_{1-x}Ge_x$, where $0<x<1$. An isolation feature is formed in the silicon-germanium epitaxy layer to define a pixel region and a periphery region of the silicon-germanium epitaxy layer. An active pixel cell and a logic circuit are formed in the pixel region and in the periphery region of the silicon-germanium epitaxy layer respectively.

In accordance with certain embodiments, the present disclosure discloses a method for fabricating an image sensor device. In this method, a silicon substrate is provided. A silicon-germanium epitaxy layer is formed on the silicon substrate, in which the silicon-germanium epitaxy layer has a composition of $Si_{1-x}Ge_x$, where $0<x<0.05$. An isolation feature is formed in the silicon-germanium epitaxy layer to define a pixel region and a periphery region of the silicon-germanium epitaxy layer. An active pixel cell and a logic circuit are formed in the pixel region and in the periphery region of the silicon-germanium epitaxy layer respectively.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for fabricating an image sensor device, the method comprising:
providing a silicon-based substrate, wherein the silicon-based substrate has a top surface and a bottom surface opposite to the top surface of the silicon-based substrate;
forming a silicon-germanium epitaxy layer on the silicon-based substrate and connected to the top surface of the silicon-based substrate, wherein the silicon-germanium epitaxy layer has a top surface and a bottom surface opposite to the top surface of the silicon-germanium epitaxy layer, the silicon-germanium epitaxy layer is formed from $Si_{1-x}Ge_x$, where $0<x<1$, and x is constant from the bottom surface of the silicon-germanium epitaxy layer to the top surface of the silicon-germanium epitaxy layer, wherein the silicon-based substrate is formed from silicon or $Si_{1-y}Ge_y$, where $0<y<x$, and y is constant or is increasing from the bottom surface of the silicon-based substrate to the top surface of the silicon-based substrate;
forming an isolation feature in the silicon-germanium epitaxy layer and between a pixel region and a periphery region of the silicon-germanium epitaxy layer, wherein the isolation feature extends from the silicon-based substrate to the top surface of the silicon-germanium epitaxy layer; and
forming an active pixel cell and a logic circuit in the pixel region and in the periphery region of the silicon-germanium epitaxy layer respectively.

2. The method of claim 1, wherein in the $Si_{1-x}Ge_x$, $0<x\leq0.05$.

3. The method of claim 1, wherein the silicon-germanium epitaxy layer is formed to have a thickness substantially in a range from 2 nanometers to 60 nanometers.

4. The method of claim 1, wherein the silicon-germanium epitaxy layer is formed to have a thickness substantially in a range from 3 nanometers to 10 nanometers.

5. The method of claim 1, wherein forming the logic circuit comprises forming a CMOS logic circuit in the periphery region.

6. The method of claim 1, wherein the isolation feature is formed to comprise a silicon oxide, a trench isolation, a silicon dioxide or a field oxide (FOX).

7. The method of claim 1, wherein the logic circuit is formed to comprise a complimentary metal-oxide-semiconductor (CMOS) logic circuit.

8. A method for fabricating an image sensor device, the method comprising:
providing a silicon-based substrate, wherein the silicon-based substrate has a top surface and a bottom surface opposite to the top surface of the silicon-based substrate;
forming a silicon-germanium epitaxy layer on the silicon-based substrate, wherein the silicon-germanium epitaxy layer has a top surface and a bottom surface opposite to the top surface of the silicon-germanium epitaxy layer, and the bottom surface of the silicon-germanium epitaxy layer is connected to the top surface of the silicon-based substrate, wherein the silicon-germanium epitaxy layer is formed from $Si_{1-x}Ge_x$, where $0<x<1$, and x is increasing from the bottom surface of the silicon-germanium epitaxy layer to the top surface of the silicon-germanium epitaxy layer, wherein the silicon-based substrate is formed from silicon or $Si_{1-y}Ge_y$, where $0<y<x$, and y is constant or is increasing from the bottom surface of the silicon-based substrate to the top surface of the silicon-based substrate;
forming an isolation feature in the silicon-germanium epitaxy layer and between a pixel region and a periphery region of the silicon-germanium epitaxy layer, wherein the isolation feature extends from the silicon-based substrate to the top surface of the silicon-germanium epitaxy layer; and forming an active pixel cell and a logic circuit in the pixel region and in the periphery region of the silicon-germanium epitaxy layer respectively.

9. The method of claim 8, wherein the silicon-germanium epitaxy layer is formed to have a thickness substantially in a range from 2 nanometers to 60 nanometers.

10. The method of claim 8, wherein the silicon-germanium epitaxy layer is formed to have a thickness substantially in a range from 3 nanometers to 10 nanometers.

11. The method of claim 8, wherein forming the logic circuit comprises forming a CMOS logic circuit in the periphery region.

12. The method of claim 8, wherein the isolation feature is formed to comprise a silicon oxide, a trench isolation, a silicon dioxide or a field oxide.

13. The method of claim 8, wherein the bottom surface of the silicon-germanium epitaxy layer is formed from $Si_{0.95}Ge_{0.05}$.

14. The method of claim 13, wherein the top surface of the silicon-germanium epitaxy layer is formed from $Si_{0.6}Ge_{0.4}$.

15. A method for fabricating an image sensor device, the method comprising:
providing a silicon-based substrate, wherein the silicon-based substrate has a top surface and a bottom surface opposite to the top surface of the silicon-based substrate;
forming a silicon-germanium epitaxy layer on the silicon-based substrate, wherein the silicon-germanium epitaxy layer has a top surface and a bottom surface opposite to the top surface of the silicon-germanium epitaxy layer, and the bottom surface of the silicon-germanium epitaxy layer is connected to the top surface of the silicon-based substrate, wherein the silicon-germanium epitaxy layer is formed from $Si_{1-x}Ge_x$, where $0<x\leq0.05$, and x is increasing from the bottom surface of the silicon-germanium epitaxy layer to the top surface of the silicon-germanium epitaxy layer, wherein the silicon-based substrate is formed from $Si_{1-y}Ge_y$, where $0<y<x$, and y is increasing from the bottom surface of the silicon-based substrate to the top surface of the silicon-based substrate;
forming an isolation feature in the silicon-germanium epitaxy layer and between a pixel region and a periphery region of the silicon-germanium epitaxy layer, wherein the isolation feature extends from the silicon-based substrate to the top surface of the silicon-germanium epitaxy layer; and
forming an active pixel cell and a logic circuit in the pixel region and in the periphery region of the silicon-germanium epitaxy layer respectively.

16. The method of claim 15, wherein the silicon-germanium epitaxy layer is formed to have a thickness substantially in a range from 2 nanometers to 60 nanometers.

17. The method of claim 15, wherein the silicon-germanium epitaxy layer is formed to have a thickness substantially in a range from 3 nanometers to 10 nanometers.

18. The method of claim 15, wherein forming the logic circuit comprises forming a CMOS logic circuit in the periphery region.

19. The method of claim 15, wherein the bottom surface of the silicon-germanium epitaxy layer is formed from $Si_{0.95}Ge_{0.05}$.

20. The method of claim 19, wherein the top surface of the silicon-germanium epitaxy layer is formed from $Si_{0.6}Ge_{0.4}$.

* * * * *